United States Patent [19]

Baker

[11] Patent Number: 4,589,135
[45] Date of Patent: May 13, 1986

[54] ZERO PHASE SHIFT FILTERING

[76] Inventor: Edward B. Baker, 1557 Nottingham Dr., Winter Park, Fla. 32792

[21] Appl. No.: 580,030

[22] Filed: Feb. 14, 1984

[51] Int. Cl.⁴ .............................................. H03G 5/00
[52] U.S. Cl. .................................................... 381/100
[58] Field of Search .................. 381/100, 101, 99, 98; 333/132

[56] References Cited

U.S. PATENT DOCUMENTS

| | | |
|---|---|---|
| 2,771,518 | 11/1956 | Sziklai . |
| 3,657,480 | 4/1972 | Cheng et al. . |
| 4,137,510 | 1/1979 | Iwahara .................................... 333/6 |
| 4,229,619 | 10/1980 | Takahashi et al. ............. 330/109 X |
| 4,238,744 | 12/1980 | Iwahara .............................. 333/132 |
| 4,243,840 | 1/1981 | Kates . |
| 4,295,006 | 10/1981 | Tanaka et al. . |

OTHER PUBLICATIONS

Vanderkooy and Lipshitz, "The Influence of Crossover Design" 74th Convention of Audio Engineering Society, Oct. 1983.
Higgins, "A Comparison of Complementary and Kalman Filtering", IEEE Transactions on Aerospace and Electronic Systems, vol. AES-11, No. 3, May, 1975.
Bohn, "A Fourth-Order State Variable Filter for Linkwitz-Riley Active Crossover Designs", 74th Convention of Audio Engineering Society, Oct. 1983.
Lipshitz and Vanderkooy, "In-Phase Crossover Network Design", 74th Convention of Audio Engineering Society, Oct. 1983.

Primary Examiner—Forester W. Isen
Attorney, Agent, or Firm—Head, Johnson & Stevenson

[57] ABSTRACT

A frequency band filtering circuit and phase shift free crossover network comprising at each crossover frequency range between band pass filters a low-pass filter means characterized by a transfer function that decays at a second or higher order function of frequency and a high-pass filter means characterized by a transfer function that rises as a second or higher order function of frequency and wherein the respective pair of transfer functions sum to unity. By employing circuit filters characterized by high order polynomial transfer functions that sum to unity, the combination of sharp roll-off and excellent frequency separation is achieved without introducing phase distortion when the signals are recombined or summed. Such a filtering system is useful in high fidelity speaker crossover systems, various electronic signal splitting or filtering circuits (whether analog or digital) wherein the information within individual frequency bands are to be isolated and treated independent of an adjacent frequency band yet ultimately recombined and the like.

23 Claims, 9 Drawing Figures

ZERO PHASE SHIFT FILTERING

BACKGROUND OF THE INVENTION

1. Field of the Invention

The present invention relates to frequency band filtering. More specifically, this invention relates to analog as well as digital frequency band filtering wherein the roll-off of the lower pass filter and the rise of the high-pass filter in the vicinity of the crossover frequency are both characterized by high order transform functions that sum to unity, thus resulting in zero phase shift of the recombined signal when the outputs from the low-pass and high-pass filters are recombined together.

2. Description of the Prior Art

It is generally known and an accepted commercial practice to provide a conventional audio hi-fi speaker system consisting, for example, of a tweeter, mid-range and woofer speakers with a crossover circuit or frequency dividing network. Such a crossover circuit traditionally involves at least a low-pass filter, a band-pass filter and a high-pass filter which are designed to receive a signal typically from an amplifier and frequency divide the signal into appropriate bands to drive the corresponding speakers. Conveniently and in particular in the more cost effective popular stereo hi-fi systems, all three speakers and the frequency dividing circuit are incorporated into a single speaker cabinet. In such cases, it is also generally acknowledged that the crossover circuit is a compromise between the desired sharp resolution or separation between frequencies and crossover network induced distortion.

Thus, it is known that at the crossover frequency, the cut-off as a function of frequency should be, in principle, as sharp as possible to minimize the physical distortion associated with the same frequency being reproduced at two different speakers. Consequently, the transfer function characteristic of the filter should be a high order polynomial as a function of frequency (sharp rise and roll-off). However, the use of filters characterized by known higher order transfer functions produce significant phase distortion which in turn is reproduced by the speakers.

Similar dilemmas between the desired sharp delineation between frequency bands and implicit phase distortion associated with known filters with higher order transfer functions that accomplish this sharp cut off are generally found in other essentially real time frequency splitting applications. For example, in such areas as communications, data transmission, seismic prospecting and the like, as well as in digital data processing or the equivalent, similar considerations arise particularly when it is desirable to preserve information within one frequency band separate from the next adjacent band, yet later combine the bands.

SUMMARY OF THE INVENTION

In view of the problems associated with the prior art crossover networks, I have discovered a general approach for designing and selecting a second order filter network that inherently exhibits the desired fast roll-off characteristic of the higher order filters and does not suffer from the phase distortion problem upon recombination of the frequency bands. This approach is quite general and can be extended to higher order filters. It basically involves any filter network device with a low-pass transfer function and a high-pass transfer function selected such that the transfer functions of adjacent filters sum to unity in the vicinity of a frequency crossover.

Thus, the present invention provides a frequency band dividing filter circuit and a phase shift free crossover circuit comprising:

(a) a signal input lead that branches into two separate band pass filter circuits;

(b) a low-pass filter means within one of the separate band pass filter circuits wherein the low-pass filter means is characterized by a transfer function that is at least of the second or higher order in frequency; and (c) a high-pass filter means within the other separate band pass filter circuits wherein the high-pass filter means is characterized by a transfer function that sums with the transfer function characteristic of the low-pass filter means such that the sum is unity.

According to the present invention, the transfer functions of the low-pass and high-pass filters are characterized by fractions wherein the denominator is a polynomial function of frequency of the order of 3 or greater and the numerator of the fraction, characteristic of the transfer function of the low-pass filter means, is a polynomial function of frequency of the order of at least two less than the polynomial of the denominator or an equivalent mathematical relationship.

It is an object of the present invention to provide a frequency band dividing electronic filter system that involves splitting an input signal or the equivalent without introducing a relative phase shift or phase distortion in the resulting frequency band filtered signals when they are recombined. It is a further object to provide such a zero phase shift system that splits an input signal into frequency bands with rapid roll-off and excellent frequency resolution between adjacent bands. It is a further object to provide a hi-fi crossover circuit of faster cut-off, better frequency split and reduced phase distortion. Fulfillment of these objects and the presence land fulfillment of additional objects will be apparent upon complete reading of the specification and claims taken in conjunction with the attached drawings.

DESCRIPTION OF THE PREFERRED EMBODIMENTS

Figure 1:
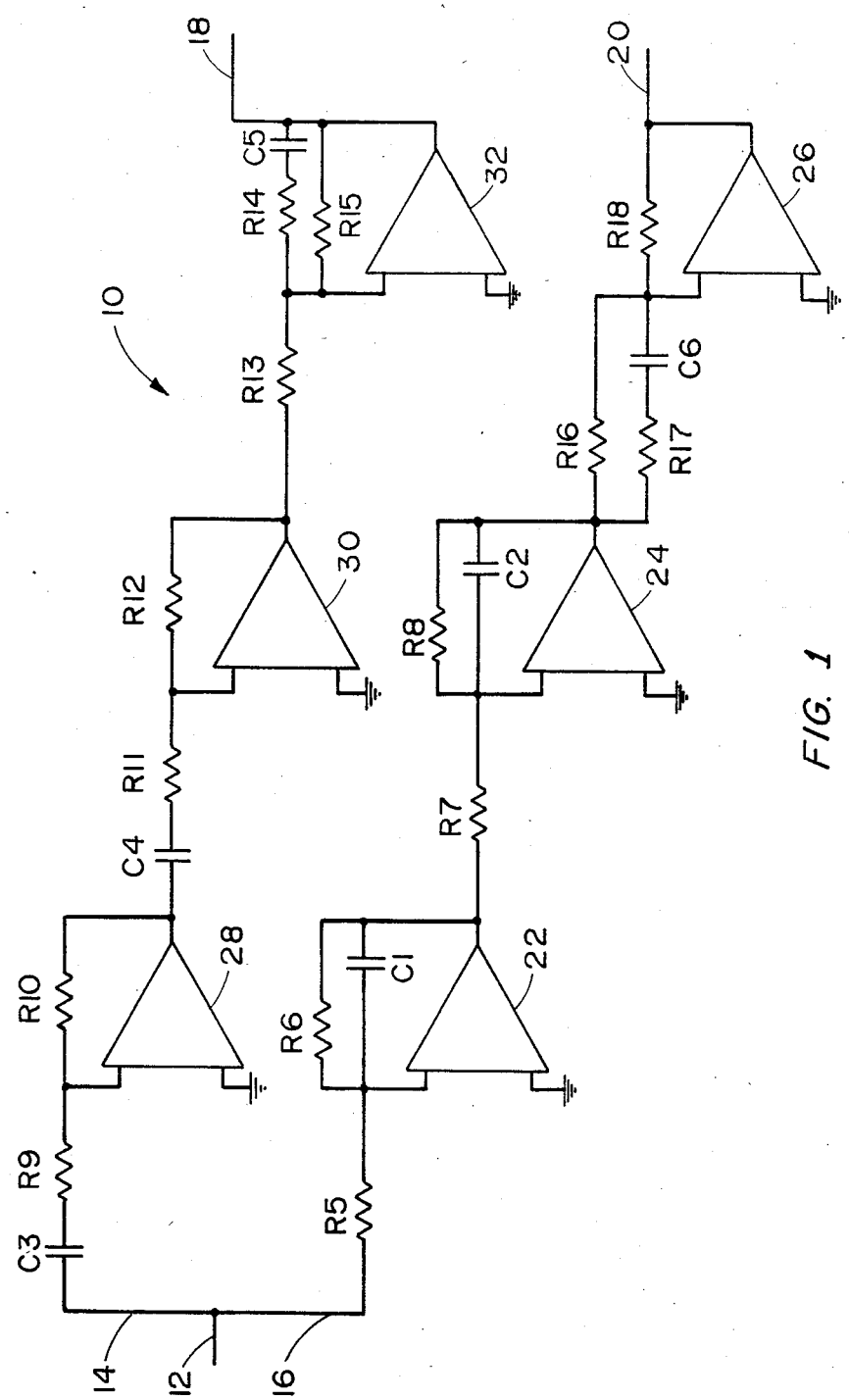
FIG. 1 illustrates a schematic of the zero phase shift filter crossover network according to the present invention.

The zero phase shift filtering and crossover circuit according to the present invention, how it is incorporated into specific applications, how it differs from the prior art and the advantages of its use can perhaps be best explained and understood by reference to the drawings. However, in explaining and illustrating the frequency band dividing filter circuit and specifically the zero phase shift hi-fi crossover circuit according to the present invention, the concept of providing band pass filters characterized by higher order transfer functions that sum to unity requires a certain degree of formal definition.

In using the expression "characterized by a transfer function that is at least of the second or higher order in frequency" to describe and claim the band pass filters according to the present invention, it should be understood that we are referring to the classical filter transfer function as defined generally as the ratio of the output signal of the filter divided by the input signal (i.e., transfer function=output/input). It should be further recognized that the filter characteristic referred to as the transfer function is a complex mathematical function (i.e., contains a real and an imaginary term). Thus, it should be appreciated by the reader that the mathematical expression of the transfer function explicitly recited in the present description have been expressed using complex frequency notation ($S = \sigma + jw$), thus, simplifying the notation presented herein. In this context, the higher order in frequency and the corresponding polynomial expansion representative of the transfer function of specific embodiments (as illustrated and claimed later) are, in principle, referring to complex mathematical functions characteristic of the filter.

Furthermore, in view of the above, the expression "is at least of the second or higher order in frequency" refers specifically to a transfer function for the low-pass filter wherein the lead term (first non-zero coefficient) of the polynomial expansion of the numerator or its equivalent exceeds the lead term of a polynomial expansion of the denominator or its equivalent by a frequency term raised to an exponential power of at least two greater than the exponent of the lead denominator term. More generally, the transfer functions according to the present invention can be either characteristic of a second or higher order decay (i.e., a reciprocal second order or higher polynomial) or characteristic of a second order or higher order gain (i.e., proportional to a second order or higher polynomial) and in the case of a band filter, both. More specifically, at or near the crossover frequency between a low-pass filter and a high-pass filter or either such filters with a band pass filter or two consecutive band filters, the lower frequency passing filter according to the present invention should decay at a rate proportional to a second or higher order in frequency while the upper frequency passing filter should exhibit gain at a rate proportional to a second or higher order in frequency.

Preferably, according to the present invention, the higher the exponential order in frequency of the transfer function for both decay and gain at the crossover frequency, the better the demarcation and separation between frequency band passes of the overall system. Thus, one feature of the present invention is to achieve optimum frequency separation by employing filter circuit characterized by higher order transfer functions. However, as previously stated, it is generally accepted that a higher order transfer function (higher slope at the cross-over region) inherently produces phase distortion which deleteriously effects the composite signal resulting from summing the band pass outputs.

In order to alleviate the phase distortion problem, yet preserve the desired sharp cut off or roll-off feature of the present invention, an additional novel feature or constraint is placed on the selection of the filters being employed. In addition to the transfer function being of a second or higher order the sum of the transfer functions of the low-pass filter and the transfer function of the high-pass filter in the region of the crossover frequency must sum to unity. The combination of the low-pass filter decaying at a rate characteristic of a transfer function which is a reciprocal higher order polynomial function of the frequency and the high-pass filter transfer function summing with this low-pass transfer function producing unity implicity defines the transfer function for the high-pass filter as a higher order polynomial gain function and more specifically, as the mathematical transfer function inverse of the low-pass filter transfer function. It is this general relationship that is felt to be novel and highly useful in that it results in a significant reduction in phase distortion associated with the filtering process and system (as illustrated later).

In implementing the improved filtering system according to the present invention and in selecting the specific filters, the overall process can be viewed as involving three basic steps. First, a filter circuit characterized by specific factorable polynomial is theoretically envisioned. Then, the polynomial is factored to establish a theoretical description of a plurality of fractions (a numerator factor divided by the polynomial) that corresponds to the filter branches of the band passes. The system is then implemented either by creating analog filter circuits designed according to the mathematical model or the equivalent numerical quadrature formula is programmed digitally.

The selection process for establishing the mathematical form of the transfer functions characterizing the low-pass and high-pass filters involves, as previously stated, preferably fractions wherein the denominator is a high order polynomial function of frequency which is separable into at least two component polynomials. These component polynomials, which when added together produce the polynomial denominator as the sum, are then used as the numerators for the respective transfer functions of the network branches (the band pass filters). In this manner, a sum of such polynomial fractions will result in unity and the corresponding electrical filter circuit signals formed from the sum of (or recombined) outputs from the individual filters will be free of phase distortion. Thus, generally, the polynomial transfer functions of the low-pass filter or branch circuit is characterized by the mathematical polynomial equation:

$$\frac{\sum_{i=0}^{m} k_i S^i}{\sum_{i=0}^{n} k_i S^i} \qquad (1)$$

and the transfer function for the high-pass filter is characterized by the polynomial equation:

$$\frac{\sum_{i=m+1}^{n} k_i S^i}{\sum_{i=0}^{n} k_i S^i} \qquad (2)$$

where $1 \leq m \leq n-1$ and S is complex frequency.

In one preferred embodiment, the polynomial expressions have the first and last coefficients set equal to 1 which allows the polynomial to be readily separated into two separate polynomial factors (i.e., $k_0 = k_n = 1.0$ and $m = n-1$). In such cases, the general formula for the second, third and fourth order transfer functions for the low-pass and high-pass filter having the following mathematical form:

Second Order Low-Pass Filter
$$\frac{k_1 S + 1}{S^3 + k_2 S^2 + k_1 S + 2} \qquad (3)$$

Second Order High-Pass Filter
$$\frac{S^3 + k_2 S^2}{S^3 + k_2 S^2 + k_1 S + 1} \qquad (4)$$

Third Order Low-Pass Filter
$$\frac{k_2 S^2 + k_1 S + 1}{S^5 + k_4 S^4 + k_3 S^3 + k_2 S^2 + k_1 S + 1} \qquad (5)$$

Third Order High-Pass Filter
$$\frac{S^5 + k_4 S^4 + k_3 S^3}{S^5 + k_4 S^4 + k_3 S^3 + k_2 S^2 + k_1 S + 1} \qquad (6)$$

Fourth Order Low-Pass Filter
$$\frac{k_3 S^3 + k_2 S^2 + k_1 S + 1}{S^7 + R_6 S^6 + k_5 S^5 + k_4 S^4 + k_3 S^3 + k_2 S^2 + k_1 S + 1} \qquad (7)$$

Fourth Order High-Pass Filter
$$\frac{S^7 + k_6 S^6 + k_5 S^5 + k_4 S^4}{S^7 + k_6 S^6 + k_5 S^5 + k_4 S^4 + k_3 S^3 + k_2 S^2 + k_1 S^1 + 1} \qquad (8)$$

Specific examples of such higher order, fractional, polynomial transfer function equations would include by way of example, but not limited thereof:

Second Order Low-Pass (Type 1)
$$\frac{2S + 1}{S^3 + 2S^2 + 2S + 1} \qquad (9)$$

Second Order High-Pass (Type 1)
$$\frac{S^3 + 2S^2}{S^3 + 2S^2 + 2S + 1} \qquad (10)$$

Second Order Low-Pass (Type 2)
$$\frac{4S + 1}{S^3 + 4S^2 + 4S + 1} \qquad (11)$$

Second Order High-Pass (Type 2)
$$\frac{S^3 + 4S^2}{S^3 + 4S^2 + 4S + 1} \qquad (12)$$

Third Order Low-Pass $$\frac{40S^2 + 10S + 1}{S^5 + 10S^4 + 40S^3 + 40S^2 + 10S + 1} \qquad (13)$$

Third Order High-Pass
$$\frac{S^5 + 10S^4 + 40S^3}{S^5 + 10S^4 + 40S^3 + 40S^2 + 10S + 1} \qquad (14)$$

In other embodiments of the present invention and in general, it should be appreciated that the transfer function according to the present invention can be expressed in mathematical forms that are equivalent to the polynomial fractional expression above, but explicitly different and still be in principle and in fact higher order in rate of decay and gain at the crossover frequency and free of phase distortion. For example, the polynomial coefficient, particularly for the lead term in the numerator of the low-pass filter, can be parametrically defined to allow for even greater flexibility. In such a case, the transfer function may take the form as follows wherein the perameter p may either vary or be fixed in the circuit design.

$$\text{Low-Pass Filter: } \frac{(1-p)k_m S^m + \sum_{i=0}^{m-1} k_i S^i}{\sum_{i=0}^{m-1} k_i S^i} \qquad (15)$$

$$\text{High-Pass Filter: } \frac{\sum_{i=0}^{m-1} k_i S^i + p k_m S^m}{\sum_{i=0}^{m-1} k_i S^i} \qquad (16)$$

Further, it is contemplated that the respective transfer functions according to the present invention can be characterized by a product of polynomials. For example, the low-pass filter can be expressed or characterized by the product of polynomials $G_1(s) \cdot G_2(s)$ and the transfer function for the high-pass filter would be characterized by the product of polynomials $G_3(s) \cdot G_4(s)$ where $G_1(s) + G_3(s) = 1.0$. In such a system the polynomials $G_2(s)$ and $G_4(s)$ are intentionally present to acknowledge the presence of a filter contribution that does not necessarily represent pure zero phase shift filtering. Examples of such filtering would involve intentionally introducing of a time delay, nonlinear contribution, noise filtering as well as other filtering steps specifically performed on one band pass and not on the other. In this respect, it should be recognized that the filtering circuits according to the present invention can intentionally be designed to come arbitrarily as close to zero phase shift filtering as desired as well as generally be combined in one step or more with other desirable filtering processes (e.g., noise suppression, automatic frequency gain control, convolution, deconvolution and the like).

In order to illustrate the system implementation step wherein the transfer functions are used to create the analog filter circuit, reference to the attached figures of the drawing is appropriate. FIG. 1 illustrates a schematic of one embodiment of a zero phase shift filter or crossover network according to the present invention, generally designated by the numeral 10. The particular embodiment illustrated is a second order phase shift free audio crossover network characterized by the transfer functions of previous equations 11 and 12 (type 2) as further explained and identified more specifically later. In presenting the following description of the implementation step according to the present invention, it should be appreciated that the description is made specifically in terms of an audio hi-fi crossover network. However, the principles being illustrated are generally applicable to any time it is desirable to split an information carrying or containing signal into one or more frequency bands, for what ever reason, with the intent of ultimately recombing the frequency bands, in some manner, without distorting or destroying the information content of the signal.

In the illustrated embodiment, an audio input signal from an appropriate audio amplifier or the like is applied to the input lead 12 of the crossover network 10. Preferably the audio amplifier signal passes through an input buffer circuit (not shown) prior to entering the crossover network 10 as generally known in the art. The incoming signal of lead 12 splits into a high pass branch 14 and a low pass branch 16 ultimately exiting the crossover network 10 as a high frequency output signal via output lead 20. Again preferably, the audio output signals pass through an output buffer circuit (not shown) prior to driving an appropriate speaker.

The actual crossover circuit in this specific embodiment and as illustrated in FIG. 1 comprises six active elements arranged as two parallel frequency band pass circuits of three serial elements each. As previously indicated the low pass circuit or branch 16 corresponds to or is characterized by the polynomial transfer function having a numerator of $4S+1$ (equation 11). The specific implementation of this low frequency band pass filter involves a series of three operational amplifiers 22, 24 and 26 with associated resistors and capacitors which conceptually can be viewed, in this illustrated embodiment, as a pair of lag filters followed by a lead/lag filter. While, the high pass branch 14 corresponds to the polynomial transfer function having a numerator $S^3+4S^2$ (equation 12) involves three operational amplifiers 28, 30 and 32 again with associated resistors and capacitors which conceptually amount to two lead/lag filters in cascade with a single lag/lead filters. In specifically implementing or creating the explicit electrical circuit, the choice of elements (selection of resistance and/or capacitance values etc.) will depend on the desired cut-off or crossover frequency. For the particular embodiment illustrated in FIG. 1, The following table specifies a set of typical commercially available operational amplifiers or active elements as defined on the left of the table in combination with corresponding resistance and capacitance values on the right that achieve the specified frequency value as the crossover frequency. In presenting the data of the table the elements and component values are specified and identified by use of the reference symbles on FIG. 1. It should be further appreciated that since the illustrated embodiment involves active elements (op-amps) an associated power tree or voltage source circuit (not shown) is implicitly present.

TABLE

| | component | 150 Hz | 250 Hz | 500 Hz | 800 Hz | 1200 Hz |
|---|---|---|---|---|---|---|
| 22;24;28;30 | (OP-AMP TL084C) | — | — | — | — | — |
| 23;36 | (OP-AMP TL084C) | — | — | — | — | — |
| C1;C3;C4;C6 | (PS 50WV CAP.) | .1 | .1 | .1 | .01 | .01 |
| C2;C5 | (PS 50WV CAP.) | .01 | .01 | .01 | .001 | .001 |
| R5;R6;R9;R10 | (¼W Mt Film 1% RES) | 10.6K | 6.34K | 3.18K | 19.9K | 13.3K |
| R7;R8 | (¼W Mt Film 1% RES) | 40.5K | 24.3K | 12.2K | 76K | 51.1K |
| R11;R12 | (¼W Mt Film 1% RES) | 22.8K | 16.5K | 8.33K | 52.1K | 34.8K |
| R18 | (¼W Mt Film 1% RES) | 9.59K | 5.76K | 2.88K | 18K | 12.4K |
| R16 | (¼W Mt Film 1% RES) | 14.6K | 8.87K | 4.4K | 27.5K | 18.3K |
| R13 | (¼W Mt Film 1% RES) | 9.16K | 5.49K | 2.79K | 17.2K | 11.2K |
| R15 | (¼W Mt Film 1% RES) | 14K | 8.45K | 4.2K | 26.3K | 17.4K |
| R14;R17 | (¼W Mt Film 1% RES) | 26.5K | 15.8K | 7.96K | 49.8K | 33.2K |

In presenting the above specific embodiment with explicit numerical values as expressed in the table, it should be appreciated not only will the values depend on the cut-off or crossover frequency but also on the particular choice of transfer function and the particular circuit design employed to implement that transfer function. In other words, the above example should not be viewed as being unduly limiting, either in terms of selection of circuit values, their arrangement or the number of elements present. For not only is the particular choice of crossover frequencies and transfer functions considered to be non-unique (provided the overall transfer functions sum to unity) but also the specific circuit implementation is not unique nor the only method of circuit design that corresponds to the given transfer functions. In the particular illustrated polynomial transfer functions of FIG. 1, it is contemplated that both the high and low branches can readily be designed to involve two active elements rather than three and in principle as single operational amplifiers. Such alternate embodiments offer some economy of size. Thus any circuit design that preserves the desired and selected transfer function characteristic is to be considered equivalent for purposes of this invention. Consequently, the use of active elements (op-amps) as illustrated in the audio hi-fi crossover network embodiment of FIG. 1 and the table can be readily replaced with other equivalent circuitry and elements, again as well known in the art. In fact, such substitutions are viewed as desirable and necessary in certain applications such as in high frequency communication applications (mega Hz) and the like wherein active elements such as op-amps have to be replaced with passive elements and appropriate net working.

To further illustrate the advantages of the hi-fi crossover network of the present invention as specifically illustrated in FIG. 1 and to illustrate generally the concept of using transfer functions that sum to unity, a hi-fi circuit corresponding to FIG. 1 was assembled and tested. The response curves of the higher order transfer functions of the present invention were compared to the known response curves of the prior art devices. The results of this comparative analysis are presented in FIGS. 2 through 6.

Figure 2:
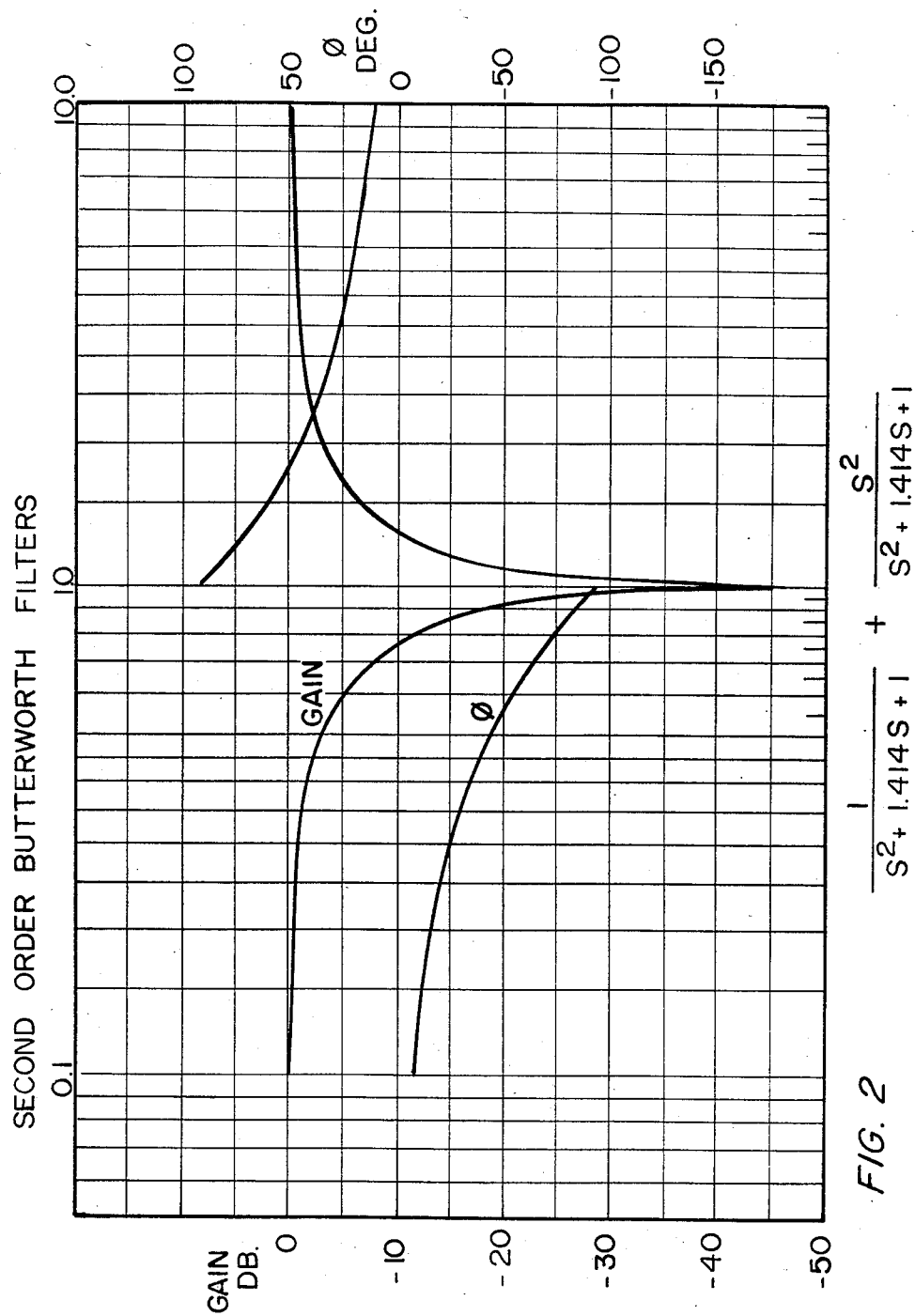
FIG. 2 illustrates the gain and phase responses of the summed (or recombined) output of a second order crossover network of the prior art.

FIG. 2 illustrates the phase ($\Phi$) curves and amplitude (gain) curves characteristic of second order Butterworth filters used in an audio hi-fi crossover network and corresponding to the following transfer functions, as generally known in the prior art, which in contrast to the transfer functions of the present invention do not sum to unity:

LOW-PASS $$\frac{1}{S^3 + 1.414S + 1}$$

HIGH-PASS $$\frac{S^2}{S^3 + 1.414S + 1}$$

In FIG. 2 and following figures unless otherwise specified, the abscissa represents a normalized frequency relative to the crossover frequency (numerically equal to 1.0) by virtue of dividing all frequencies by the crossover frequency. The left hand ordinate represents amplitude or gain in terms of dB loss and the right ordinate represents phase in terms of degrees lead and lag. As illustrated in FIG. 2, the gain characteristic of the second order Butterworth filter is theoretically ideal in that both the low-pass and high-pass sharply drop off at the crossover frequency. However, the phase characteristic exhibits a discontinuity (inversion) at the crossover frequency. Thus, in principle and in fact, to utilize the prior art second order Butterworth filter in a hi-fi crossover network, a compromise between having a finite, non-zero, gain at the crossover frequency in order to produce a signal at the crossover frequency (i.e., an overlap of the low-pass and high-pass gain curves) and the presence of a significant phase shift (i.e., approximately an 80° lag to an 80° lead discontinuity at the crossover) results in speakers producing sound at the crossover frequency, but out of phase. This in turn leads to constructive and destructive interference or more explicitly, an interferometer type, antenna sound reproduction pattern that varies as the function of position relative to the speakers as is well known in the art.

Figure 3:
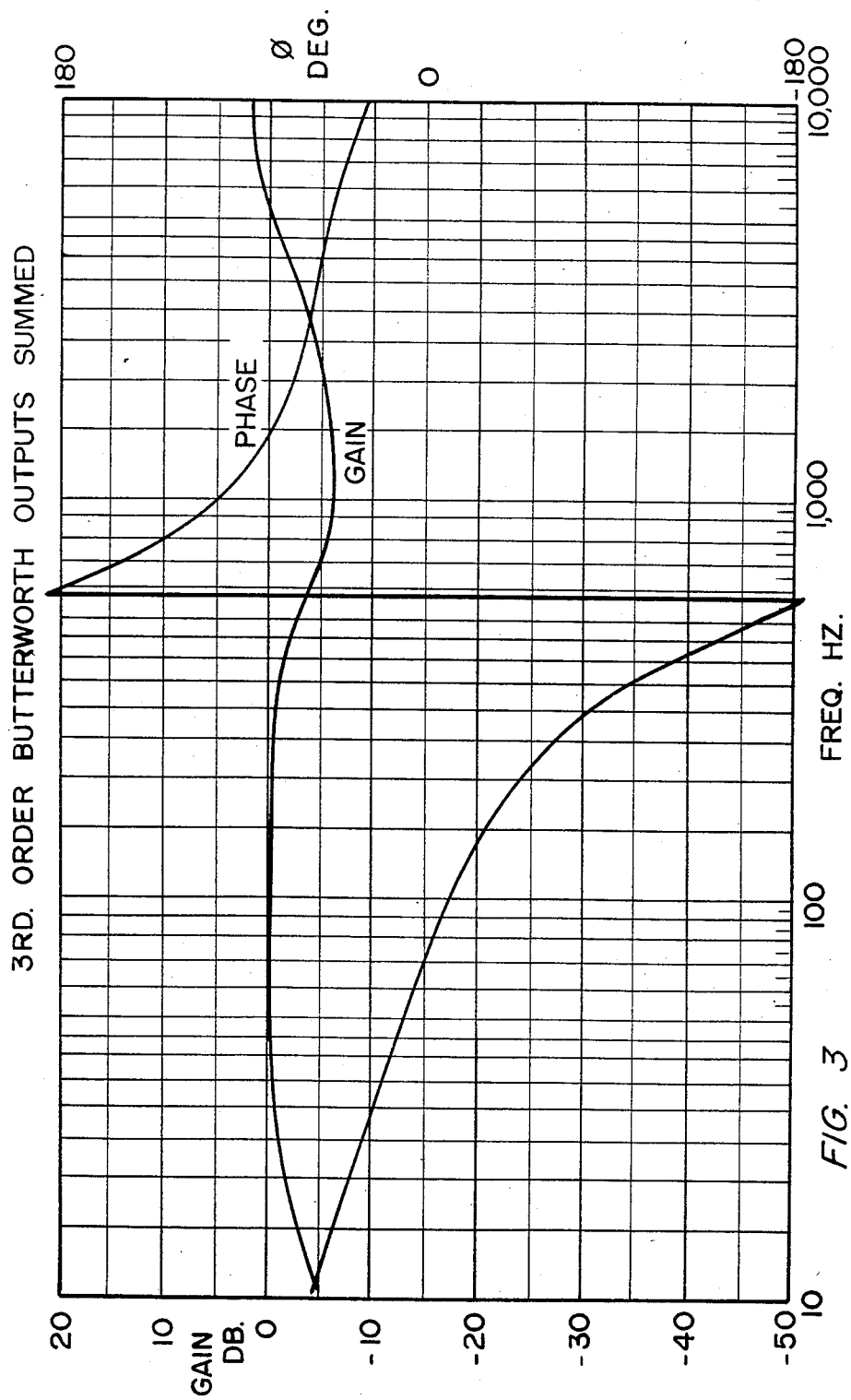
FIG. 3 illustrates the gain and phase responses for the summed (or recombined) output of a third order crossover network of the prior art.

FIG. 3 illustrates a non-normalized gain and phase response curves of the summed outputs from a commercially available standard third order Butterworth crossover network with center frequency, in this case, at approximately 580 Hz. As seen in FIG. 3, the curves are far from being categorically flat response curves. The gain curve exhibits an oscillation or variation of about 5 dB across the frequency range while the phase response exhibits a significant discontinuity or inversion at the crossover frequency. This overall performance, as illustrated in FIGS. 2 and 3, are considered typical of commercially available, higher order, crossover networks of the prior art.

Figure 4:
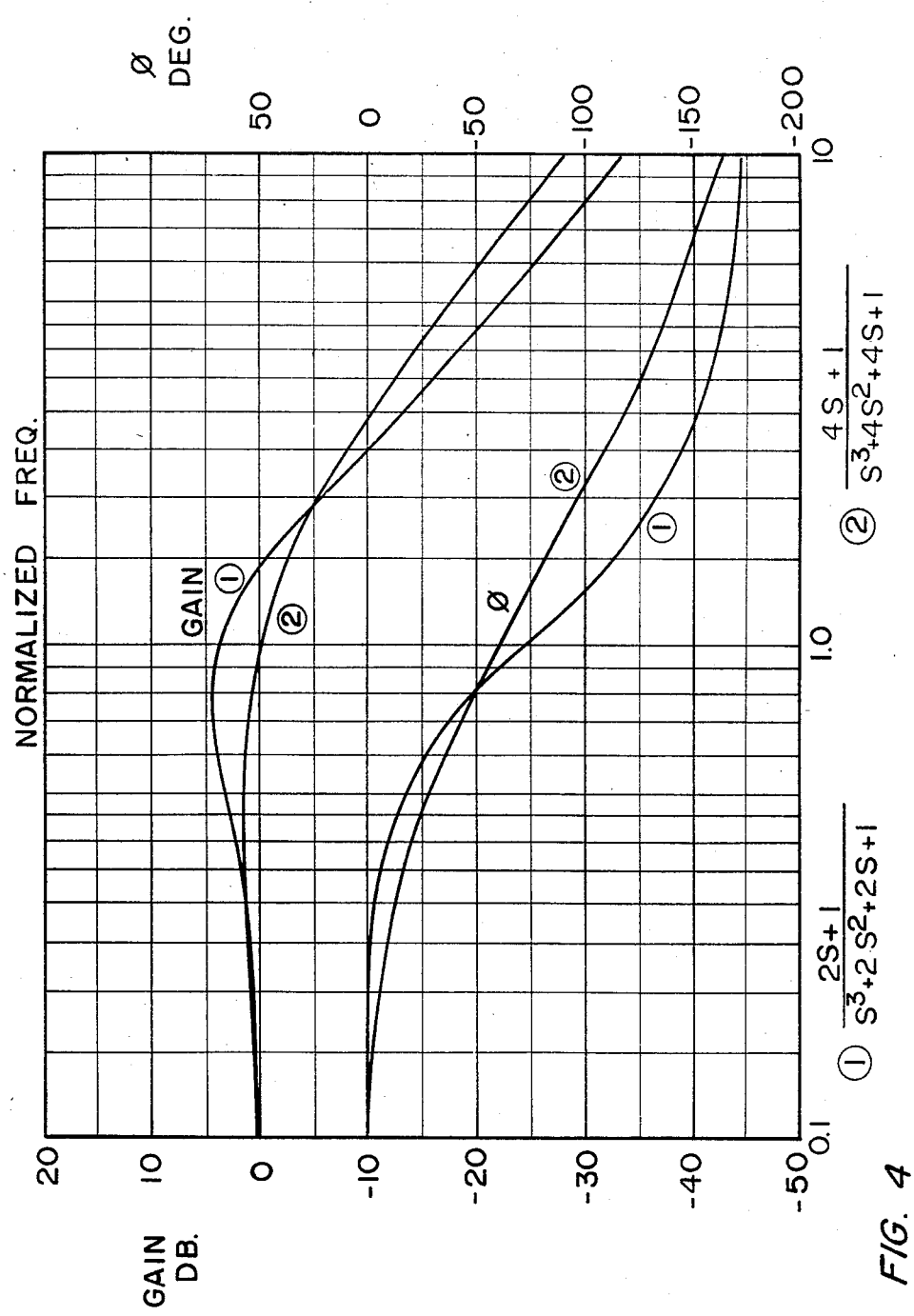
FIG. 4 illustrates the individual gain and phase responses for two different second order low-pass filters according to the present invention.

FIG. 4 illustrates the gain and phase characteristic of two types of second order low-pass band filters according to the present invention, again expressed in a normalized frequency similar to the presentation of FIG. 2. The amplitude curve (gain 1) and the phase curve ($\Phi_1$) are characteristic of second order transfer functions having a numerator of $2S+1$ (equation 9, Type 1) while the amplitude (gain 2) and phase ($\Phi_2$) curves are characteristic of a second order transfer function having a numerator of $4S+1$ (equation 10, Type 2). As further illustrated in FIG. 3, there are subtle differences between the filter characteristics depending on the selection of transfer functions even though they are of the same higher order. For example, the gain 1 curve ($2S+1$) exhibits a relative peak or rise just prior to the crossover frequency and then drops off at a steeper slope than the gain 2 curve ($4S+1$). Thus, variations in the characteristics of the filter can be achieved by selection of the transfer function.

Figure 5:
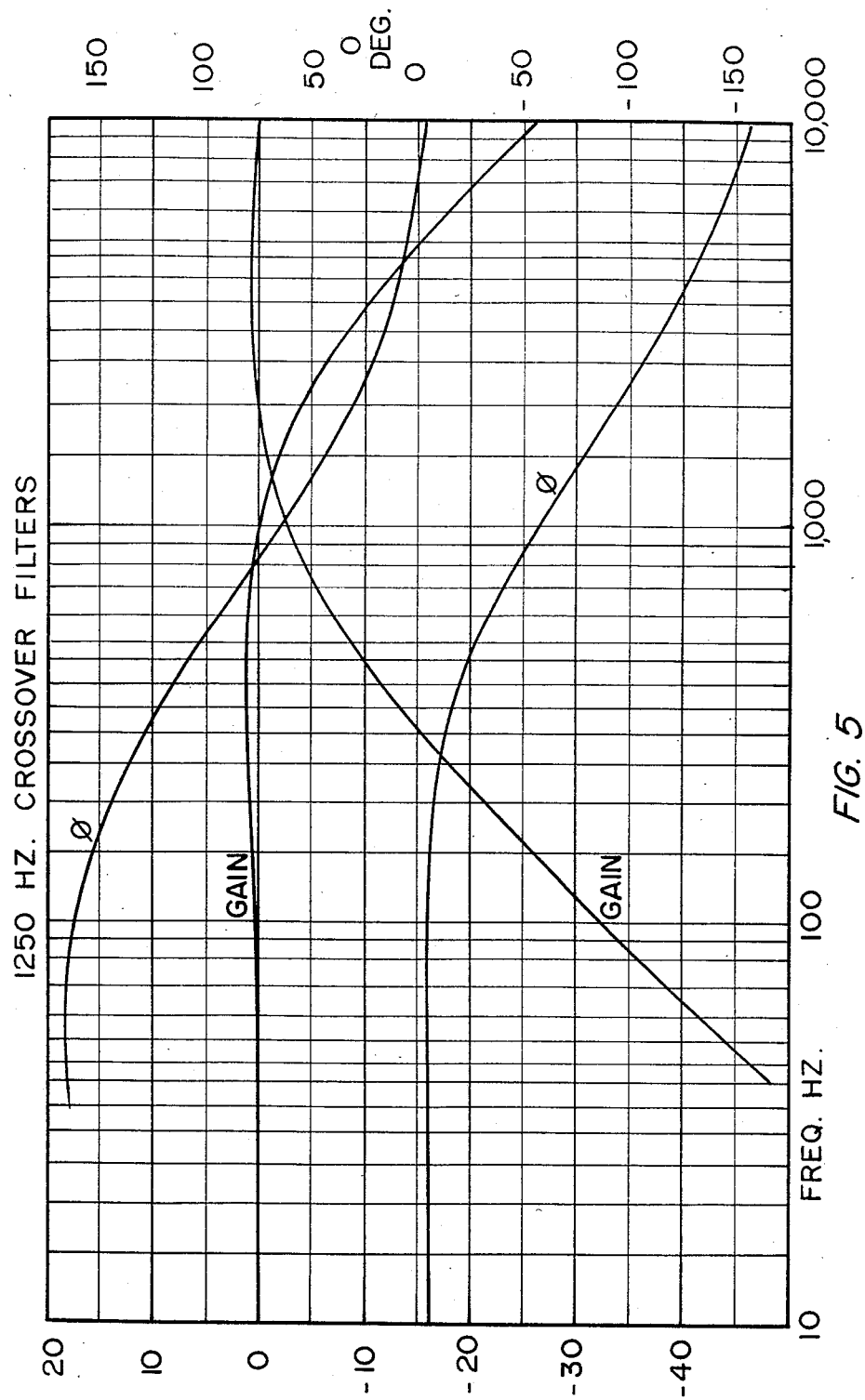
FIG. 5 illustrates the individual gain and phase responses for the low-pass and high-pass second order filters of the crossover network of FIG. 1.
Figure 6:
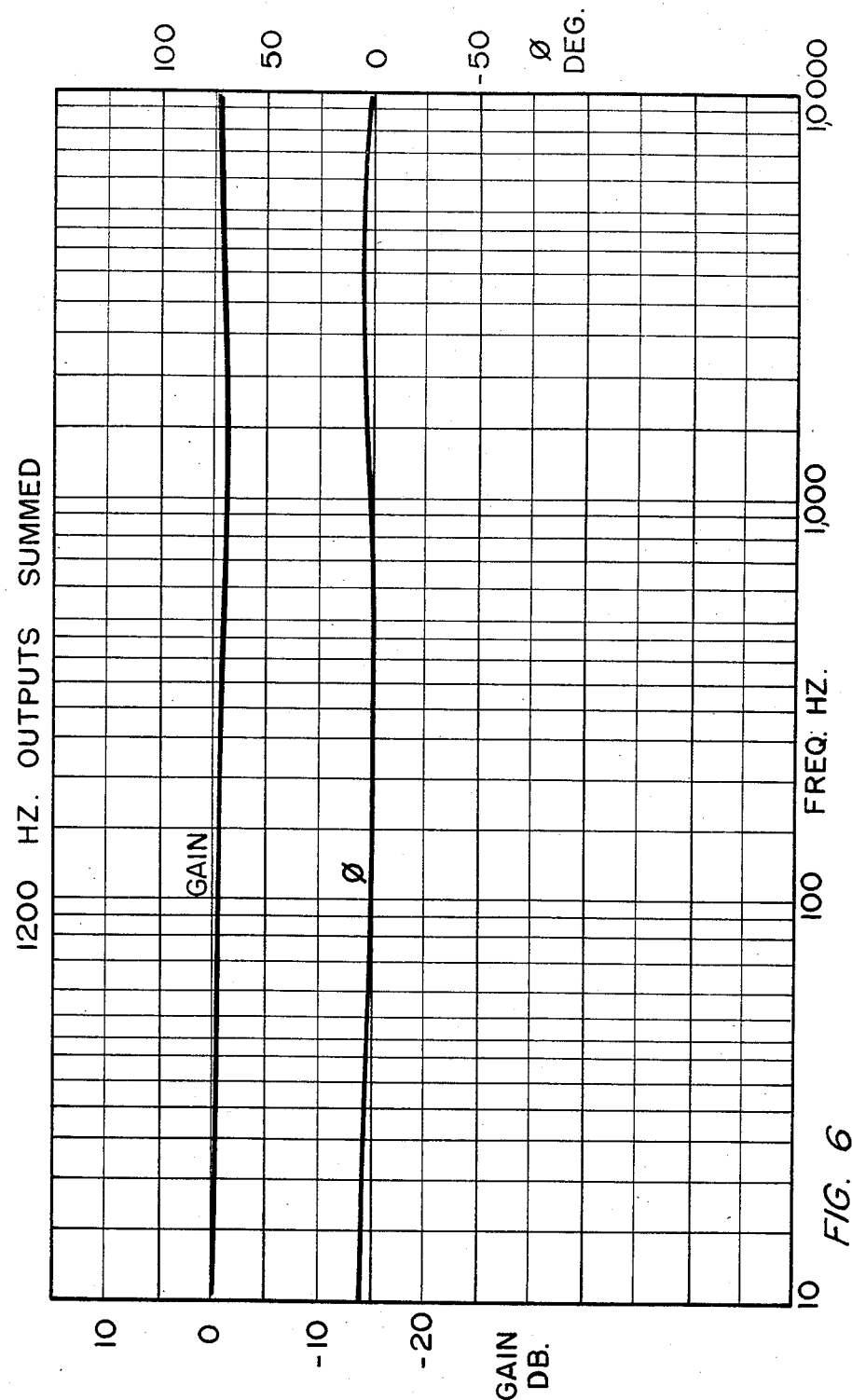
FIG. 6 illustrates the gain and phase responses of the summed (or recombined) outputs of the crossover network of FIG. 5.

FIG. 5 illustrates the actual filter characteristic for a 1250 Hz second order crossover network specified in the previous table and as illustrated in FIG. 1. As specifically illustrated, the phase curves are complementary in appearance, while the gain curves show the desired higher order drop off centered about 1250 Hz, the crossover frequency. FIG. 6 illustrates the summed output response curves when using the crossover network filters illustrated in FIG. 5. As clearly seen in FIG. 6, the summed gain and phase response curves are essentially flat across the frequency range of interest including the crossover frequency. Not only does the present invention provide for essentially flat response curves as illustrated in FIG. 6, but the lack of phase distortion has been independently confirmed by real time Lissajous pattern analysis of the crossover circuit.

It is felt that the additional mathematical constraint (i.e., transfer functions summing to unity) placed on the design of the filter circuit according to the present invention results in a crossover network or complementary filter network that exhibits the desirable properties and characteristics of being simultaneously a higher order rapid drop off filter circuit and an essentially zero phase shift or phase shift free filter circuit. Thus, in the broadest sense, the present invention provides a design criteria which results in a family of novel complementary filters. It is envisioned that the complementary filters of the present invention are generally useful in any filter application wherein it is desirable to separate or split a signal into two or more frequency components without introducing phase distortion when the signals are recombined. The present invention is viewed as being useful in situations wherein high frequency resolution, isolation or separation between partitioned frequency bands is desired.

Figure 7:
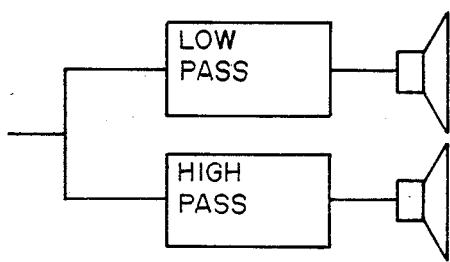
FIG. 7 is a schematic illustration of a low-pass and high-pass hi-fi crossover network according to the present invention.
Figure 8:
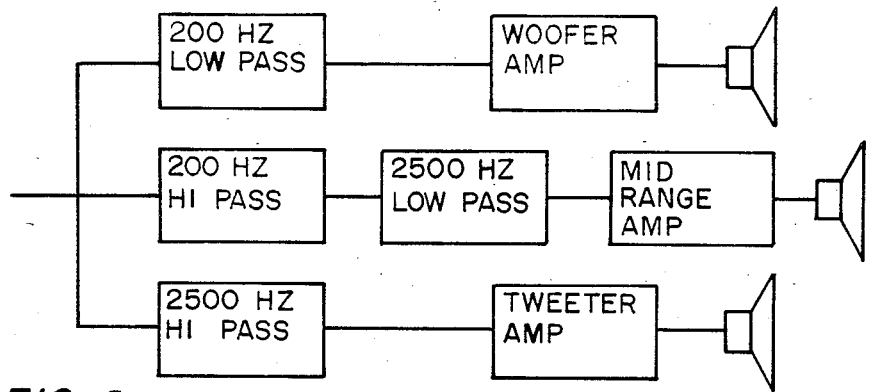
FIG. 8 is a schematic illustration of a cascaded pair of hi-fi crossover networks of FIG. 1 with individual amplifiers and speakers, thus creating a mid-range band pass.

In the case of an audio hi-fi crossover network application, the basic filter network can easily be incorporated as a single frequency split resulting in two separate frequency bands as illustrated in FIG. 7. However, the present invention can be just as easily incorporated into a plurality of frequency bands, each driving separate speakers as illustrated conceptually in FIG. 8. In this embodiment, the filter circuits are essentially serially arranged to create a mid-range band pass having both a high-pass filter at the lower frequency and a low-pass filter at the higher frequency crossover. This concept can be extended to essentially any of the multiple band audio networks or the like, as generally known in the art. The present invention also provides for a more direct approach to multiple frequency band splitting crossover networks, such as illustrated conceptually in FIG. 9 wherein the numerator of the polynomial transfer functions literally separates into a series of components each corresponding to the numerator of a given polynomial transfer function or frequency band of the overall network as suggested by the following polynomial transfer functions that again sum to unity:

$$\frac{S^7 + k_6S^6}{S^7 + k_6S^6 + k_5S^5 + k_4S^4 + k_3S^3 + k_2S^2 + k_1S^1 + 1} \tag{17}$$

$$\frac{k_5S^5 + k_4S^4}{S^7 + k_6S^6 + k_5S^5 + k_4S^4 + k_3S^3 + k_2S^2 + k_1S^1 + 1} \tag{18}$$

$$\frac{k_3 S^3 + k_2 S^2}{S^7 + k_6 S^6 + k_5 S^5 + k_4 S^4 + k_3 S^3 + k_2 S^2 + k_1 S^1 + 1} \quad (19)$$

$$\frac{k_2 S + 1}{S^7 + k_6 S^6 + k_5 S^5 + k_4 S^4 + k_3 S^3 + k_2 S^2 + k_1 S^1 + 1} \quad (20)$$

Figure 9:
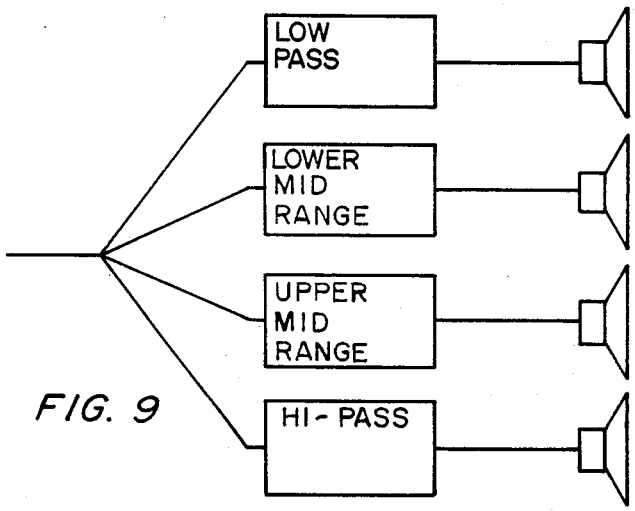
FIG. 9 is a schematic illustration of a multiple frequency band splitting crossover network creating a plurality of band passes according to the present invention.

In other words, the multiple frequency band splitting crossover network of FIG. 9 involves a plurality of successive low-pass filters followed by a high-pass filter wherein the polynomial transfer function of each successive low-pass filter is characterized by polynomial equation:

$$\frac{\sum_{i=(m_{N-1}+1)}^{m_N} k_i S^i}{\sum_{i=0}^{n} k_i S^i} ; \quad (21)$$

$m_0 = 0$ and $1 \leq m_1 < m_2 < m_3 \ldots m_N < \ldots = n.$ where N designates the Nth band pass starting an expediential power of $m_{N-1}+1$ up to an expediential power of $m_N$ of the overall n degreed polynomial and wherein the transfer function of the high-pass filter sums with the plurality of transfer functions characteristic of the low-pass filters such that the sum is unity. More specifically, the transfer functions for such a plurality of band pass circuits are characterized by the polynomial series:

$$\frac{k_0 + k_1 S}{\sum_{i=0}^{2n-1} k_i S^i} + \frac{k_2 S^2 + k_3 S^3}{\sum_{i=0}^{2n-1} k_i S^i} + \ldots +$$

$$\frac{k_{2n-2} S^{2n-2}}{\sum_{i=0}^{2n-1} k_i S^i} + \frac{k_{2n-1} S^{2n-1}}{\sum_{i=0}^{2n-1} k_i S^i}$$

which corresponds to the general case for the polynomial transfer functions illustrated in equation (17) through (20) above. Another specific case of a plurality of band pass circuits corresponding to equation (21) are transfer functions characterized by the polynomial series:

$$\frac{k_0 + k_1 S + k_2 S^2}{\sum_{i=0}^{2n-1} k_i S^i} + \frac{k_3 S^3 + k_4 S^4 + k_5 S^5}{\sum_{i=0}^{2n-1} k_i S^i} + \ldots +$$

$$\frac{k_{2N-3} S^{2n-3} + k_{2n-2} S^{2n-2} + k_{2n-1} S^{2n-1}}{\sum_{i=0}^{2n-1} k_i S^i}$$

Although the present invention has been explicitly exemplified in terms of an audio hi-fi crossover network, the basic concept and thus the scope of the present invention is contemplated to be generally applicable to any analog or digital signal filtering process and apparatus. More specifically, the invention is envisioned as being applicable to any frequency band splitting process or apparatus wherein it is desirable to isolate one or more frequency bands for whatever purpose without introducing significant phase distortion. Thus, the present invention has multiple applications in the communication arts including telecommunication, satellite communication, or the like as well as sonar, radar, and microwave applications. The present invention is further generally applicable to scientific instrumentation, biofeed back equipment or similar equipment requiring frequency band splitting. Thus, the present invention further finds application in geophysical exploration, seismic survey, seismic analysis, oil well logging and the like in the form of instrumentation, equipment and data processing including reducing the filters to digital equivalents for numerical analysis of seismic traces and the like. And, the present invention has generally been applicable in audio equipment and processes including crossover speaker networks, audio equalizers and acoustic detector circuits.

Having thus described the invention with a certain degree of particularity, it is manifest that many changes can be made in the details of construction, arrangement and fabrication of the elements and their uses without departing from the spirit and scope of the invention. Therefore, it is to be understood that the invention is not limited to the embodiments set forth herein for purposes of exemplication, but is to be limited only to the scope of the attached claims, including a full range of equivalents to which each element thereof is entitled.

I claim:

1. A frequency band dividing filter circuit comprising:
   (a) a signal input lead that branches into two separate band pass filter circuits;
   (b) a low-pass filter means within one of said separate band pass filter circuits wherein said low-pass filter means is characterized by a transfer function; and
   (c) a high-pass filter means within said other separate band pass filter circuits wherein said high-pass filter means is characterized by a transfer function that sums with said transfer function characteristic of said low-pass filter means such that the sum is unity, and wherein said transfer functions of said low-pass and high-pass filter means are characterized by fractions wherein the denominator of said fractions is a polynomial function of frequency of the order of three or greater and wherein the numerator of the fraction characteristic of the transfer function of said low-pass filter means is a polynomial function of frequency of an order at least two less than said polynomial of the denominator, but greater than zero.

2. A frequency band dividing filter circuit of claim 1 wherein said transfer function of said low-pass filter means is characterized by a product of polynominals $G_1(s) \cdot G_2(s)$ and wherein said transfer function for said high-pass filter means is characterized by a product of polynomials $G_3(s) \cdot G_4(s)$ where $G_1(s) + G_3(s) = 1.0$.

3. A frequency band dividing filter circuit of claim 1 wherein said transfer function for said low-pass filter means is characterized by the polynomial equation:

$$\frac{\sum_{i=0}^{m} k_i S^i}{\sum_{i=0}^{n} k_i S^i}$$

and wherein said transfer function for said high-pass filter means is characterized by the polynomial equation:

$$\frac{\sum_{i=m+1}^{n} k_i S^i}{\sum_{i=0}^{n} k_i S^i}$$

where the number $1 \leq m \leq n-1$ and S is frequency.

4. A frequency band dividing filter circuit of claim 3 wherein $m=n-1$ and $k_0=k_n=1.0$.

5. A frequency band dividing filter circuit of claim 4 wherein said transfer function of said low-pass filter means is:

$$\frac{k_1 S + 1}{S^3 + k_2 S^2 + k_1 S + 2}$$

and wherein said transfer function for said high-pass filter is:

$$\frac{S^3 + k_2 S^2}{S^3 + k_2 S^2 + k_1 S + 1}.$$

6. A frequency band dividing filter circuit of claim 4 wherein said transfer function for said low-pass filter means is:

$$\frac{k_2 S^2 + k_1 S + 1}{S^5 + k_4 S^4 + k_3 S^3 + k_2 S^2 + k_1 S + 1}$$

and wherein said transfer function for said high-pass filter means is:

$$\frac{S^5 + k_4 S^4 + k_3 S^3}{S^5 + k_4 S^4 + k_3 S^3 + k_2 S^2 + k_1 S + 1}.$$

7. A frequency band dividing filter circuit of claim 4 wherein said transfer function for said low-pass filter means is:

$$\frac{R_3 S^3 + k_2 S^2 + k_1 S + 1}{S^7 + R_6 S^6 + k_5 S^5 + k_4 S^4 + k_3 S^3 + k_2 S^2 + k_1 S + 1}$$

and wherein said transfer function for said high-pass filter means is:

$$\frac{S^7 + k_6 S^6 + k_5 S^5 + k_4 S^4}{S^7 + k_6 S^6 + k_5 S^5 + k_4 S^4 + k_3 S^3 + k_2 S^2 + k_1 S^1 + 1}.$$

8. A frequency band dividing filter circuit of claim 5 wherein said transfer function for said low-pass filter means is:

$$\frac{2S + 1}{S^3 + 2S^2 + 2S + 1}$$

and wherein said transfer function for said high pass filter means is:

$$\frac{S^3 + 2S^2}{S^3 + 2S^2 + 2S + 1}.$$

9. A frequency band dividing filter circuit of claim 5 wherein said transfer function for said low-pass filter means is:

$$\frac{4S + 1}{S^3 + 4S^2 + 4S + 1}$$

and wherein said transfer function for said high-pass filter means is:

$$\frac{S^3 + 4S^2}{S^3 + 4S^2 + 4S + 1}.$$

10. A frequency band dividing filter circuit of claim 6 wherein said transfer function for said low-pass filter means is:

$$\frac{40S^2 + 10S + 1}{S^5 + 10S^4 + 40S^3 + 40S^2 + 10S + 1}$$

and wherein said transfer function for said high-pass filter means is:

$$\frac{S^5 + 10S^4 + 40S^3}{S^5 + 10S^4 + 40S^3 + 40S^2 + 10S + 1}.$$

11. A frequency band dividing filter circuit of claim 2 wherein said transfer function for said low-pass filter means is:

$$\frac{(1-p)k_m S^m + \sum_{i=0}^{m-1} k_i S^i}{\sum_{i=0}^{m-1} k_i S^i}$$

and wherein said transfer function for said high-pass filter means is:

$$\frac{\sum_{i=0}^{m-1} k_i S^i + p k_m S^m}{\sum_{i=0}^{m-1} k_i S^i}.$$

12. In an audio multiple spaker system a crossover network comprising: an audio signal lead that divides, at least once, into two parallel paths each path representing a separate frequency band pass wherein the first frequency band pass is a low-pass filter circuit characterized by a transfer function and wherein the second frequency band pass is a high-pass filter circuit characterized by a transfer function that sums with said transfer function characteristic of said low-pass filter circuit such that the sum is unity wherein said transfer functions of said low-pass and high-pass circuits are characterized by fractions wherein the denominator of said fractions is a polynomial function of frequency of the order of three or greater and wherein the numerator of the fraction characteristic of the transfer function of said low-pass circuit is a polynomial function of frequency of the order of at least two less than said polynomial of the denominator, but greater than zero.

13. A phase shift free crossover network comprising:
(a) a signal input lead that branches into two separate band pass filter circuits;

(b) a low-pass filter means within one of said separate band pass filter circuits wherein said low-pass filter means is characterized by a transfer function; and (c) a high-pass filter means within said other separate band pass filter circuits wherein said high-pass filter means is characterized by a transfer function that sums with said transfer function characteristic of said low-pass filter means such that the sum is unity wherein said transfer functions of said low-pass and high-pass filter means are characterized by fractions wherein the denominator of said fractions is a polynomial function of frequency of the order of three or greater and wherein the numerator of the fraction characteristic of the transfer function of said low-pass filter means is a polynomial function of frequency of an order at least two less than said polynomial of the denominator, but greater than zero.

14. A phase shift free crossover network of claim 13 wherein said transfer function for said low-pass filter means is characterized by the polynomial equation:

$$\frac{\sum_{i=0}^{m} k_i S^i}{\sum_{i=0}^{n} k_i S^i}$$

and wherein said transfer function for said high-pass filter means is characterized by the polynomial equation:

$$\frac{\sum_{i=m+1}^{n} k_i S^i}{\sum_{i=0}^{n} k_i S^i}$$

where the number $1 \leq m \leq n-1$ and $S$ is frequency.

15. A phase shift free crossover network of claim 14 wherein $m = n - 1$ and $k_0 = k_n = 1.0$.

16. A phase shift free crossover network of claim 15 wherein said transfer function for said low-pass filter means is:

$$\frac{k_2 S^2 + k_1 S + 1}{S^5 + k_4 S^4 + k_3 S^3 + k_2 S^2 + k_1 S + 1}$$

and wherein said transfer function for said high-pass filter means is:

$$\frac{S^5 + k_4 S^4 + k_3 S^3}{S^5 + k_4 S^4 + k_3 S^3 + k_2 S^2 + k_1 S + 1}.$$

17. A phase shift free crossover network of claim 15 wherein said transfer function for said low-pass filter means is:

$$\frac{k_3 S^3 + k_2 S^2 + k_1 S + 1}{S^7 + k_6 S^6 + k_5 S^5 + k_4 S^4 + k_3 S^3 + k_2 S^2 + k_1 S + 1}$$

and wherein said transfer function for said high-pass filter means is:

$$\frac{S^7 + k_6 S^6 + k_5 S^5 + k_4 S^4}{S^7 + k_6 S^6 + k_5 S^5 + k_4 S^4 + k_3 S^3 + k_2 S^2 + k_1 S^1 + 1}.$$

18. A phase shift free crossover network of claim 15 wherein said transfer function of said low-pass filter means is:

$$\frac{k_1 S + 1}{S^3 + k_2 S^2 + k_1 S + 2}$$

and wherein said transfer function for said high-pass filter is:

$$\frac{S^3 + k_2 S^2}{S^3 + k_2 S^2 + k_1 S + 1}.$$

19. A phase shift free crossover network of claim 18 wherein said transfer function for said low-pass filter means is:

$$\frac{2S + 1}{S^3 + 2S^2 + 2S + 1}$$

and wherein said transfer function for said high-pass filter means is:

$$\frac{S^3 + 2S^2}{S^3 + 2S^2 + 2S + 1}.$$

20. A phase shift free crossover network of claim 18 wherein said transfer function for said low-pass filter means is:

$$\frac{4S + 1}{S^3 + 4S^2 + 4S + 1}$$

and wherein said transfer function for said high-pass filter means is:

$$\frac{S^3 + 4S^2}{S^3 + 4S^2 + 4S + 1}.$$

21. A frequency band dividing circuit comprising:
(a) a signal input lead that branches into a plurality of of N separate band pass circuits;
(b) a plurality of successive low-pass filter means wherein each of said low-pass filter means is characterized by a transfer function, wherein said transfer function for the Nth low-pass filter is characterized by the polynomial equation:

$$\frac{\sum_{i=(m_{N-1}+1)}^{m_N} k_i S^i}{\sum_{i=0}^{n} k_i S^i};$$

$m_0 = 0$ and $1 \leq m_1 < m_2 < m_3 \ldots m_N < \ldots = n.$

; and
(c) a high-pass filter means wherein said high-pass filter means is characterized by a transfer function that sums with the plurality of transfer functions characteristic of said plurality of successive low-pass filter means such that the sum is unity.

22. A frequency band dividing circuit of claim 21 wherein said transfer function for said plurality of band pass circuits are characterized by the polynomial series:

$$\frac{k_0 + k_1 S}{\sum_{i=0}^{2n-1} k_i S^i} + \frac{k_2 S^2 + k_3 S^3}{\sum_{i=0}^{2n-1} k_i S^i} + \ldots +$$

$$\frac{k_{2n-2} S^{2n-2}}{\sum_{i=0}^{2n-1} k_i S^i} + \frac{k_{2n-1} S^{2n-1}}{\sum_{i=0}^{2n-1} k_i S^i}.$$

23. A frequency band dividing circuit of claim 21 wherein said transfer function for said plurality of band pass circuits are characterized by the polynomial series:

$$\frac{k_0 + k_1 S + k_2 S^2}{\sum_{i=0}^{2n-1} k_i S^i} + \frac{k_3 S^3 + k_4 S^4 + k_5 S^5}{\sum_{i=0}^{2n-1} k_i S^i} + \ldots +$$

$$\frac{k_{2n-3} S^{2n-3} + k_{2n-2} S^{2n-2} + k_{2n-1} S^{2n-1}}{\sum_{i=0}^{2n-1} k_i S^i}.$$

* * * * *